(12) United States Patent
Lu et al.

(10) Patent No.: US 6,624,066 B2
(45) Date of Patent: Sep. 23, 2003

(54) RELIABLE INTERCONNECTS WITH LOW VIA/CONTACT RESISTANCE

(75) Inventors: Jiong-Ping Lu, Richardson, TX (US); Ching-Te Lin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/783,157

(22) Filed: Feb. 14, 2001

(65) Prior Publication Data

US 2002/0110999 A1 Aug. 15, 2002

(51) Int. Cl.[7] ............................................. H01L 21/4763
(52) U.S. Cl. ........................ 438/643; 438/637; 438/642; 438/652; 438/653; 438/675; 438/687
(58) Field of Search ........................ 438/637, 642, 438/643, 648, 652, 653, 656, 675, 685, 687, 688

(56) References Cited

U.S. PATENT DOCUMENTS

| 5,933,753 | A | | 8/1999 | Simon | |
|---|---|---|---|---|---|
| 5,985,762 | A | | 11/1999 | Luce | |
| 6,156,648 | A | * | 12/2000 | Huang | ........................ 438/654 |
| 6,177,347 | B1 | | 1/2001 | Liu | |
| 6,211,069 | B1 | * | 4/2001 | Hu et al. | ..................... 438/637 |
| 6,284,657 | B1 | * | 9/2001 | Chooi et al. | ................. 438/687 |
| 6,287,977 | B1 | * | 9/2001 | Hashim et al. | .............. 438/722 |
| 6,335,570 | B2 | * | 1/2002 | Mori et al. | ................... 257/751 |
| 6,380,065 | B1 | * | 4/2002 | Komai et al. | ................ 438/622 |
| 6,380,082 | B2 | * | 4/2002 | Huang et al. | ................ 438/687 |
| 6,498,091 | B1 | * | 12/2002 | Chen et al. | .................. 438/627 |

FOREIGN PATENT DOCUMENTS

JP    2000-323571    * 11/2000    ......... H01L/21/768

OTHER PUBLICATIONS

Taguchi (JP 200–323571) (Translation).*

* cited by examiner

Primary Examiner—Amir Zarabian
Assistant Examiner—Maria Guerrero
(74) Attorney, Agent, or Firm—Jacqueline J. Garner; W. James Brady, III; Frederick J. Telecky, Jr.

(57) ABSTRACT

Two barrier layers are used for a via or contact. A thin CVD barrier (124) (e.g., SiN, TiSiN, TaSiN, etc.) is deposited over a structure including within a via or contact hole (106). A sputter etch is then performed to remove the CVD barrier (124) at the bottom of the via/contact. A second barrier (126) is deposited after the sputter etch. The second barrier (126) comprises a lower resistivity barrier such as Ta, Ti, Mo, W, TaN, WN, MoN or TiN since the second barrier remains at the bottom of the via or contact. A metal fill process can then be performed.

3 Claims, 4 Drawing Sheets

RELIABLE INTERCONNECTS WITH LOW VIA/CONTACT RESISTANCE

FIELD OF THE INVENTION

The invention is generally related to the field of fabricating liners/barriers in contacts, vias, and copper interconnects in semiconductor devices and more specifically to the elimination of overhang in liner/barrier/seed deposition using sputter etch.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any liner/barrier metals) are deposited, patterned, and etched to form the interconnect lines. Then, an interlevel dielectric (ILD) is deposited and planarized. In a damascene process, the ILD is formed first. The ILD is then patterned and etched. A thin liner/barrier material is then deposited over the structure followed by copper deposition over the liner/barrier material. Then, the copper and liner/barrier material are chemically-mechanically polished to remove the material from over the ILD, leaving metal interconnect lines. A metal etch is thereby avoided.

The most practical technique for forming copper interconnects is electrochemical deposition (ECD). In this process, after the liner/barrier material is deposited, a seed layer of copper is deposited. Then, ECD is used to deposit copper over the seed layer. Unfortunately, physical vapor deposition (PVD) processes typically used to deposit the liner/barrier and seed materials have poor step coverage. This is due to the fact that PVD processes use a line of sight technique. As a result, an overhang 18 of liner/barrier 14 and/or seed 16 material occurs at the top of a trench or via 12 as illustrated in FIG. 1. The overhang causes a severe problem during the subsequent copper ECD. Specifically, a seam occurs in the copper fill material.

One proposed solution for overcoming the above problem uses a pre-sputter etch after the trench and via or contact etch, but before liner/barrier deposition. Unfortunately, the sputter etch step can deposit copper onto the sidewalls. Copper can then diffuse through the dielectric and cause reliability problems.

SUMMARY OF THE INVENTION

The invention uses a two layer barrier for a via or contact. A thin CVD barrier is deposited over a structure including within a via or contact hole. A sputter etch is then performed to remove the CVD barrier at the bottom of the via/contact. A second barrier is deposited after the sputter etch. A metal fill process can then be performed.

An advantage of the invention is providing an improved interconnect process having low via/contact resistance and improved reliability.

This and other advantages will be apparent to those of ordinary skill in the art having reference to the specification in conjunction with the drawings.

DETAILED DESCRIPTION OF THE EMBODIMENTS

The invention will now be discussed with reference to forming vias in a copper damascene process. It will be apparent to those of ordinary skill in the art that the invention may also be applied to contact formation and to other metal interconnect processes.

Figure 1:
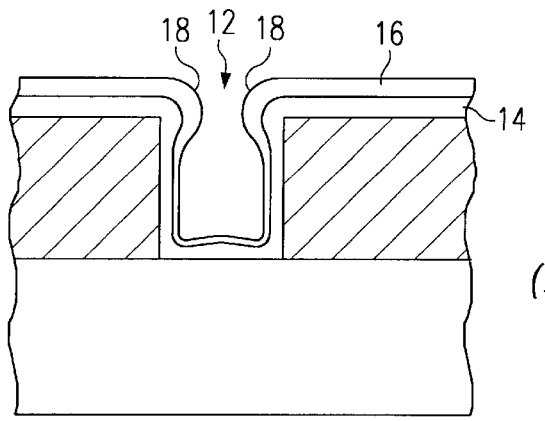
FIG. 1 is a cross-sectional view of a prior art liner/barrier/ seed process that results in an overhang of material at the top of a trench, via, or contact.
Figure 2:
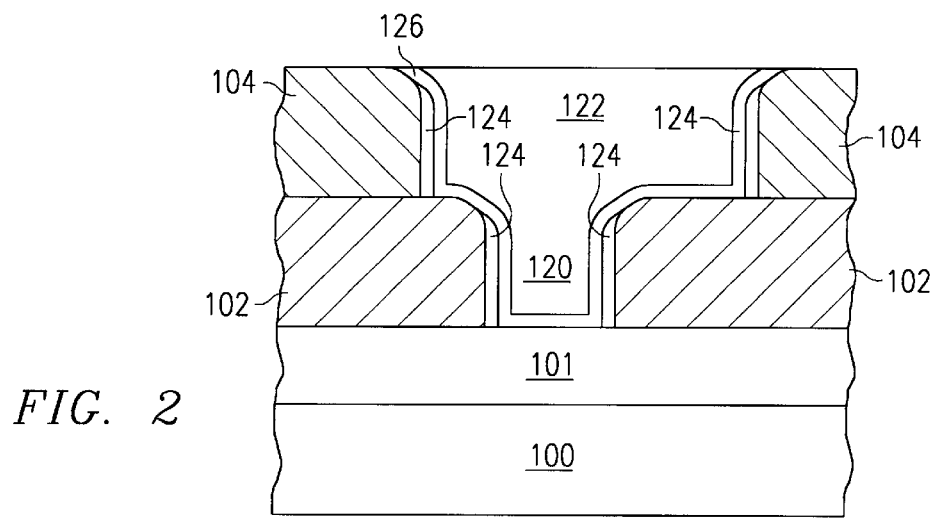
FIG. 2 is a cross-sectional diagram of a via structure formed according to the first embodiment of the invention.

A via structure 120 formed according to a first embodiment of the invention is shown in FIG. 2. Via structure 120 extends through an interlevel dielectric (ILD) 102 and connects between a lower copper interconnect 101 and an upper copper interconnect (trench structure 122). Via structure 120 comprises a first barrier/liner 124 located on the sidewalls of the via. First barrier/liner 124 does not extend along the bottom surface of the via. The thickness of first barrier/liner 124 may be in the range of 25–200 Å.

Because first barrier/liner 124 does not extend along the bottom surface of the via, the resistivity of the material used for first barrier/liner 124 is not critical. Accordingly, a wider choice of materials is available. A material having good adhesion properties and good barrier properties against copper diffusion should be selected. For example, amorphous ternary transition metal-silicon nitrides such as TaSiN, TiSiN, MoSiN or WSiN may be used even though they typically have higher resistivity. Dielectrics, such as SiN may also be used. The preferred embodiment uses TiSiN deposited by CVD. CVD TiSiN offers excellent adhesion and barrier properties. Copper doesn't diffuse through TiSiN and the silicon bonds easily with the copper at the interface, resulting in good adhesion property.

Second barrier/liner 126 is located adjacent the first barrier liner 124 on the sidewalls of the via. Second barrier liner 126 does extend along the bottom surface of the via. Accordingly, the resistivity of the second barrier/liner 126 is important. In a preferred embodiment, second barrier liner 126 comprises a lower resistivity material than first barrier/ liner 124. For example, PVD transition metals (such as Ta, Ti, Mo and W) or their nitrides such as TaN, TiN, WN, and MoN may be used. The thickness of second barrier/liner 126 is less than the thickness of prior art PVD barrier/liners. For example, the thickness may be in the range of 25–150 Å. This layer is needed to make sure Cu has good adhesion on the upper surface (the first barrier/liner is removed from the upper surface, as will be discussed below).

Figure 3A:
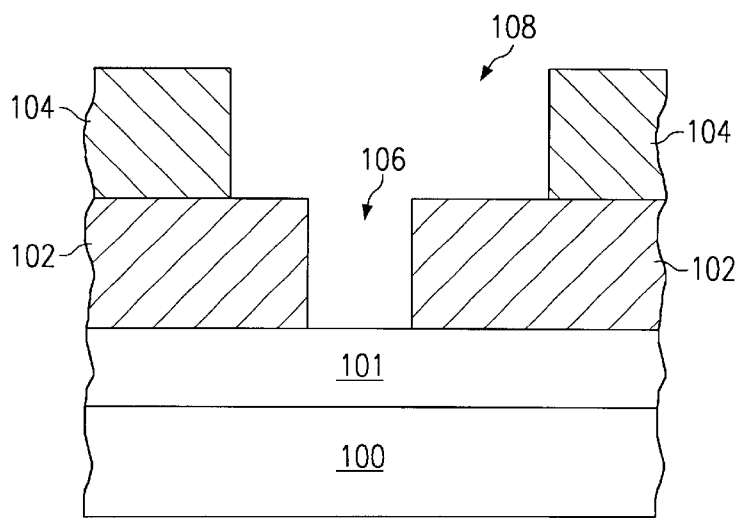
FIGS. 3A–3F are cross-sectional drawings of a copper interconnect structure formed according to the first embodiment of the invention.

A method for forming the via structure 120 of FIG. 2 will now be discussed with reference to FIGS. 3A–3F. A semiconductor body 100 is processed through formation of trench and vias in a metal interconnect level, as shown in FIG. 3A. Semiconductor body 100 typically comprises a silicon substrate with transistors and other devices formed therein. Semiconductor body 100 also includes the pre-metal dielectric (PMD) and may include one or more metal interconnect layers. Only copper interconnect 101 is shown.

An ILD (interlevel dielectric) 102 is formed over semiconductor body 100 (including copper interconnect 101).

IMD (intrametal dielectric) 104 is formed over ILD 102. An etchstop layer (not shown) may optionally be placed between ILD 102 and IMD 104. Suitable dielectrics for ILD 102 and IMD 104, such as silicon dioxides, fluorine-doped silicate glass (FSG), organo-silicate glass (OSG), hydrogen silesquioxane (HSQ), and combinations thereof, are known in the art. ILD 102 and IMD 104 are thick dielectric layers having a thickness in the range of 0.1 um–1 um.

In a copper dual damascene process, both the vias and trenches are etched in the dielectric. Via 106 is etched in ILD 102 and trench 108 is etched in IMD 104. Via 106 is used to connect to underlying metal interconnect layer 101. Trench 108 is used to form the metal interconnect lines.

Figure 3B:
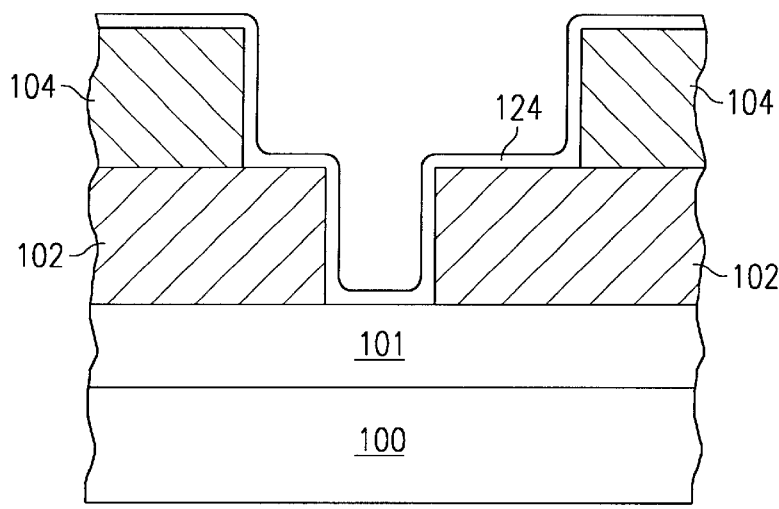
Figure 3C:
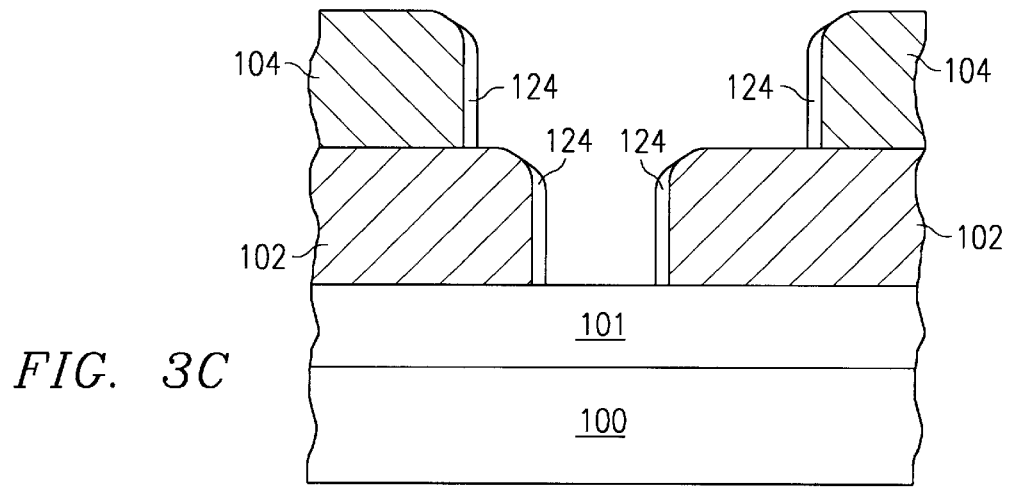

First barrier/liner layer 124 is deposited using a CVD process over IMD 104 including in trench 108 and via 106, as shown in FIG. 3B. CVD allows a thin conformal layer to be deposited. The thickness of first barrier/liner 124 may be in the range of 25–200 Å. Referring to FIG. 3C, a sputter etch is then performed. An inert gas with or without H2, such as Ar, $H_2/N_2$, or $H_2$/Ar. Argon sputtering, is used in the preferred embodiment. Sputter etching uses a line-of-sight that removes more material on the horizontal surfaces than on the vertical surfaces. Accordingly, the portions of first barrier/liner 124 on the upper surface of IMD 104, the bottom of trench 108, and the bottom of via 106 are removed. The upper corners of via 106 and trench 108 are both also pulled back.

Sputter-etching at the via bottom functions to breakthrough the barrier 124 and clean the via bottom. Because this exposes the copper from the underlying copper interconnect 101, some copper is sputtered onto the sidewalls of the via. However, the first barrier/liner 124 prevents this copper from diffusing into the dielectric and causing reliability problems.

Because first barrier/liner 124 is removed at the bottom of the via, the resistivity of the material used for first barrier/liner 124 is not critical. A material having good adhesion properties and good barrier properties against copper diffusion should be selected. For example, amorphous ternary transition metal-silicon-nitrides such as TaSiN, TiSiN or WSiN may be used even though they typically have higher resistivity. Dielectrics, such as SiN may also be used. The preferred embodiment uses TiSiN. CVD TiSiN offers excellent adhesion and barrier properties. Copper doesn't diffuse through TiSiN and the silicon bonds easily with the copper at the Cu-barrier interface.

Figure 3D:
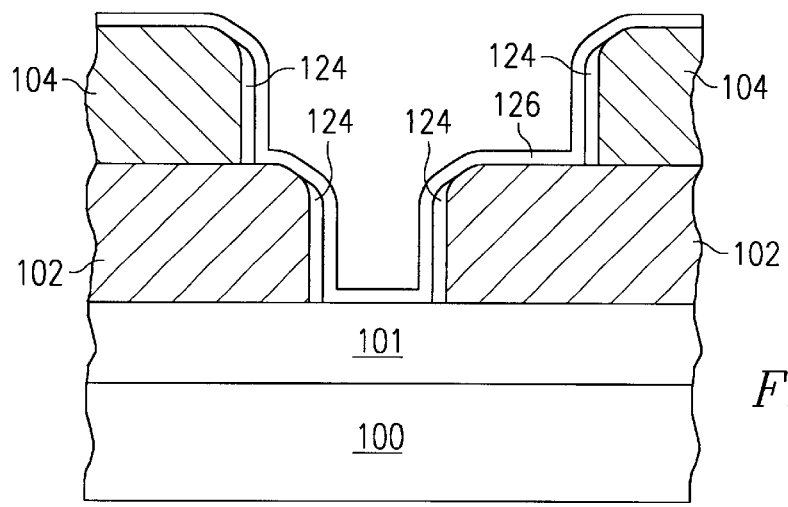

After the sputter etch, the second barrier/liner layer 126 is deposited, as shown in FIG. 3D. Either PVD or CVD may be used. The thickness of second barrier/liner layer 126 may be in the range of 25–150 Å. Because a thin layer is deposited and the top corners of the via and trench are both pulled back during the sputter etch, the overhang of the PVD barrier is not an issue. However, since the second barrier/liner 126 remains at the bottom of the via (i.e., in the electrical path), the resistivity of the second barrier/liner 126 is important. Accordingly, a PVD or CVD process with transition metal or its nitride such as Ta, Ti, Mo, W, TaN, TiN, WN, and MoN may be used.

Figure 3E:
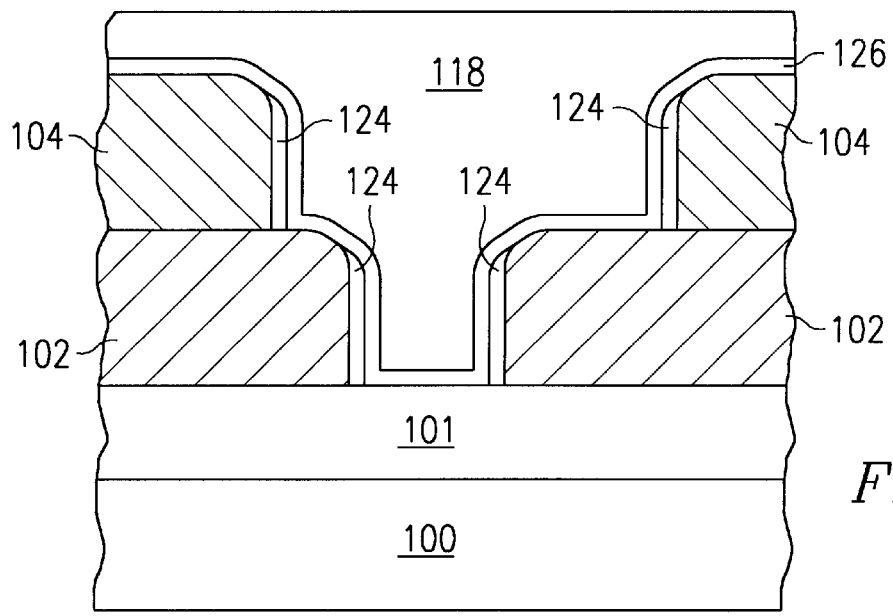

In a copper electrochemical deposition (ECD) process, a copper seed layer is deposited over the second barrier/liner layer 126. The seed layer is typically deposited using a PVD process. Copper ECD is then performed as shown in FIG. 3E to form copper layer 118. Various copper ECD processes are known in the art. In one example, a 3-step process is used. After placing the wafer in the plating solution, a current of approximately 0.75 Amps is passed through the seed layer for a time on the order of 15 secs. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 3F:
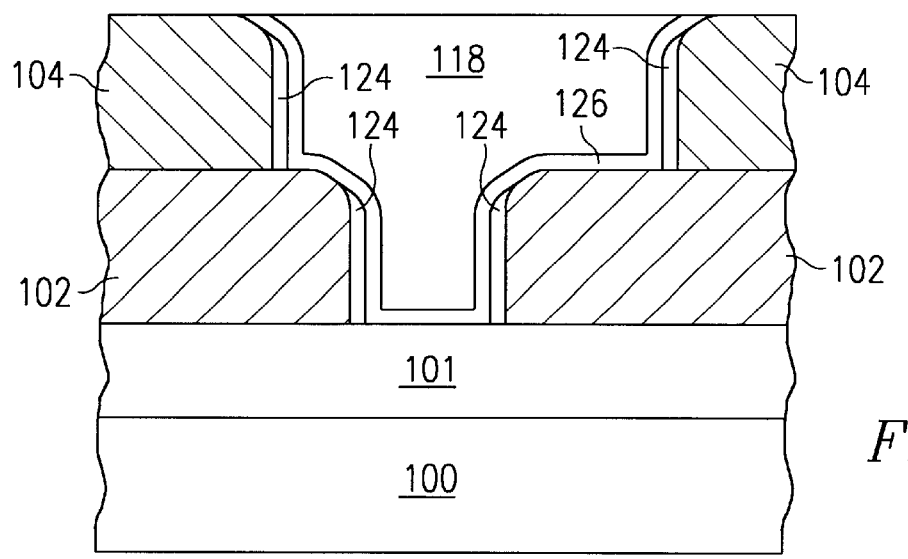

Processing then continues to chemically-mechanically polish (CMP) the copper layer 118 and second barrier/liner 126 to form the copper interconnect, as shown in FIG. 3F. An additional advantage of the invention is that the CMP is less difficult due to the thin second barrier/liner 126. A thicker barrier is more difficult to CMP. Additional metal interconnect layers may then be formed followed by packaging.

Figure 4A:
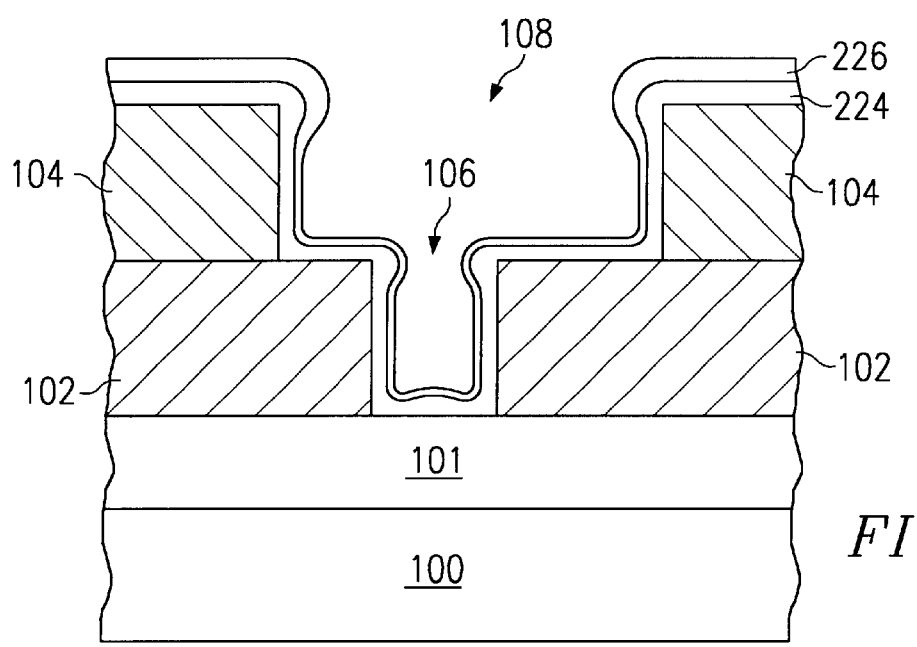
FIGS. 4A–4B are cross-sectional drawings of a contact structure formed according to a second embodiment of the invention.

A second embodiment of the invention will now be discussed with reference to FIGS. 4A–4B. As in the first embodiment, a semiconductor body 100 is processed through formation of trench 108 and vias 106 in a metal interconnect level. Then, as shown in FIG. 4A a PVD barrier layer 224 is first deposited over the structure including within the trench 108 and via 106. A thickness on the order of 250 Å is used. Since the PVD deposited barrier will remain at the bottom of the via, a low resistivity material is used. For example, ternary transition metal nitride may be used.

Next, a CVD barrier layer 226 is deposited over the PVD barrier 224. The CVD barrier layer 226 has a thickness in the range of 25–100 Å. Because the CVD barrier 226 will be removed at the bottom of the via, resistivity of the material is not critical. A material having good adhesion properties and good barrier properties against copper diffusion should be selected. For example, amorphous ternary transition metal-silicon-nitrides such as TaSiN, TiSiN or WSiN may be used even though the typically have higher resistivity. Dielectrics, such as SiN may also be used. The preferred embodiment uses TiSiN deposited by CVD.

Figure 4B:
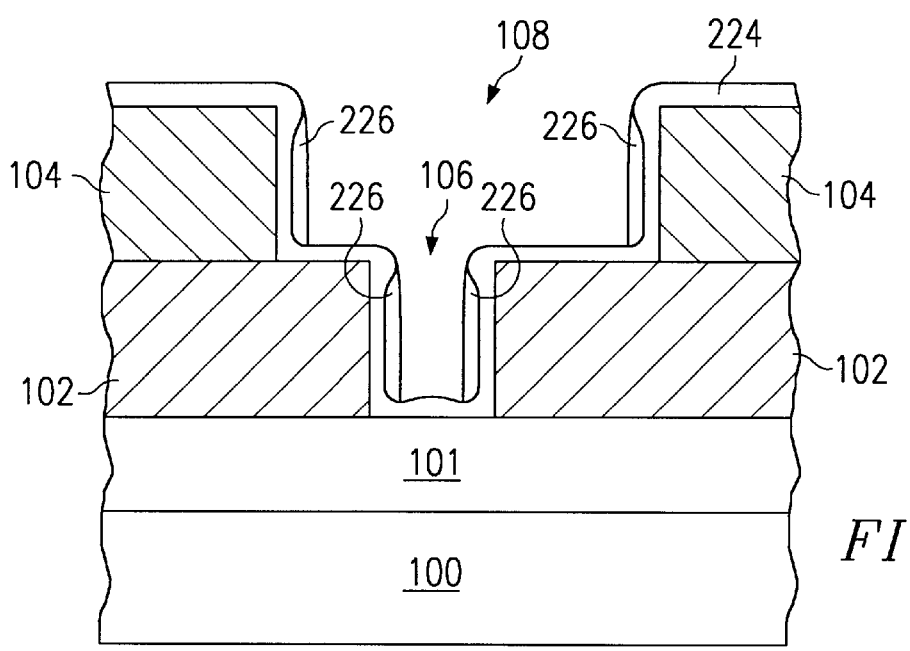

After both barrier layer have been deposited, a sputter etch is performed, as shown in FIG. 4B. An inert gas, such as argon, may be used. The sputter-etch is tuned to remove portions of CVD barrier layer 226 at the bottom of via 106 as well as on the other horizontal surfaces. During this step, the top corners of the trenches and vias are also pulled back to eliminate the overhang that is created during the PVD barrier process (layer 224).

Processing then continues with the deposition of the copper seed layer and copper fill process. The second embodiment is less preferred than the first embodiment. The sputter etch of the second embodiment is difficult to control.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the invention may be applied to forming contacts instead of vias. It is therefore intended that the appended claims encompass any such modifications or embodiments.

What is claimed is:

1. A method of fabricating an integrated circuit comprising the steps of:

providing a semiconductor body having a first and a second dielectric layer formed thereover, wherein said first dielectric layer has a via etched therein and said second dielectric layer has a trench etched therein, said trench overlying said via;

using chemical vapor deposition, depositing a first barrier layer over said second dielectric layer including within said trench and said via;

after depositing said first barrier layer, sputter etching to remove a portion of said first barrier layer from a bottom of said trench and from a bottom of said via, said sputter etching further pulling back upper corners of said trench and upper corners of said via;

after said sputter etching, depositing a second barrier layer over said first barrier layer; and filling said trench and said via with a metal.

2. The method of claim 1, wherein said second barrier is deposited using chemical vapor deposition.

3. The method of claim 1, wherein said second barrier is deposited using physical vapor deposition.

* * * * *